(12) United States Patent
Greenwood

(10) Patent No.: US 6,338,985 B1
(45) Date of Patent: Jan. 15, 2002

(54) MAKING CHIP SIZE SEMICONDUCTOR PACKAGES

(75) Inventor: Jonathon G. Greenwood, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/498,144

(22) Filed: Feb. 4, 2000

(51) Int. Cl.[7] .................. H01L 21/44; H01L 21/48; H01L 21/50; H01L 23/34; H01L 23/48

(52) U.S. Cl. ............... 438/126; 438/127; 438/108; 257/723; 257/778

(58) Field of Search ................ 438/108, 107, 438/113, 110, 124, 126, 127; 257/778, 723

(56) References Cited

U.S. PATENT DOCUMENTS

| | | | |
|---|---|---|---|
| 4,890,383 A | 1/1990 | Lumbard et al. | 29/841 |
| 6,107,689 A | * 7/1997 | Kozono | 257/778 |
| 5,700,981 A | 12/1997 | Tuttle et al. | 174/250 |
| 5,729,437 A | 3/1998 | Hashimoto | 361/760 |
| 5,776,798 A | 7/1998 | Quan et al. | 438/112 |
| 5,919,329 A | * 10/1998 | Banks et al. | 156/281 |
| 5,973,263 A | 10/1999 | Tuttle et al. | 174/52.2 |
| 5,981,314 A | 11/1999 | Glenn et al. | 438/127 |
| 6,038,136 A | 3/2000 | Weber | 361/783 |
| 6,150,193 A | 11/2000 | Glenn | 438/113 |

* cited by examiner

Primary Examiner—Wael Fahmy
Assistant Examiner—Neal Berezny
(74) Attorney, Agent, or Firm—Skjerven Morrill MacPherson LLP; Don C. Lawrence

(57) ABSTRACT

A method for making low cost chip size semiconductor packages ("CSPs") includes preparing a substrate having a first surface with metal pads and lands thereon, and an opposite second surface having openings in it through which the lands are exposed. A solder mask is formed over the first surface of the substrate, and has apertures in it through which the metal pads are exposed. At least one vent opening is formed through the substrate and solder mask. A semiconductor die is electrically connected to the substrate through the apertures in the solder mask using the "flip chip" connection method. A body of an insulative plastic material is formed on the surface of the solder mask that simultaneously overmolds the die and underfills the space between the solder mask and the die in a single step. Solder balls are attached to the lands through the openings in the second surface of the substrate to serve as package input/output terminals.

28 Claims, 6 Drawing Sheets

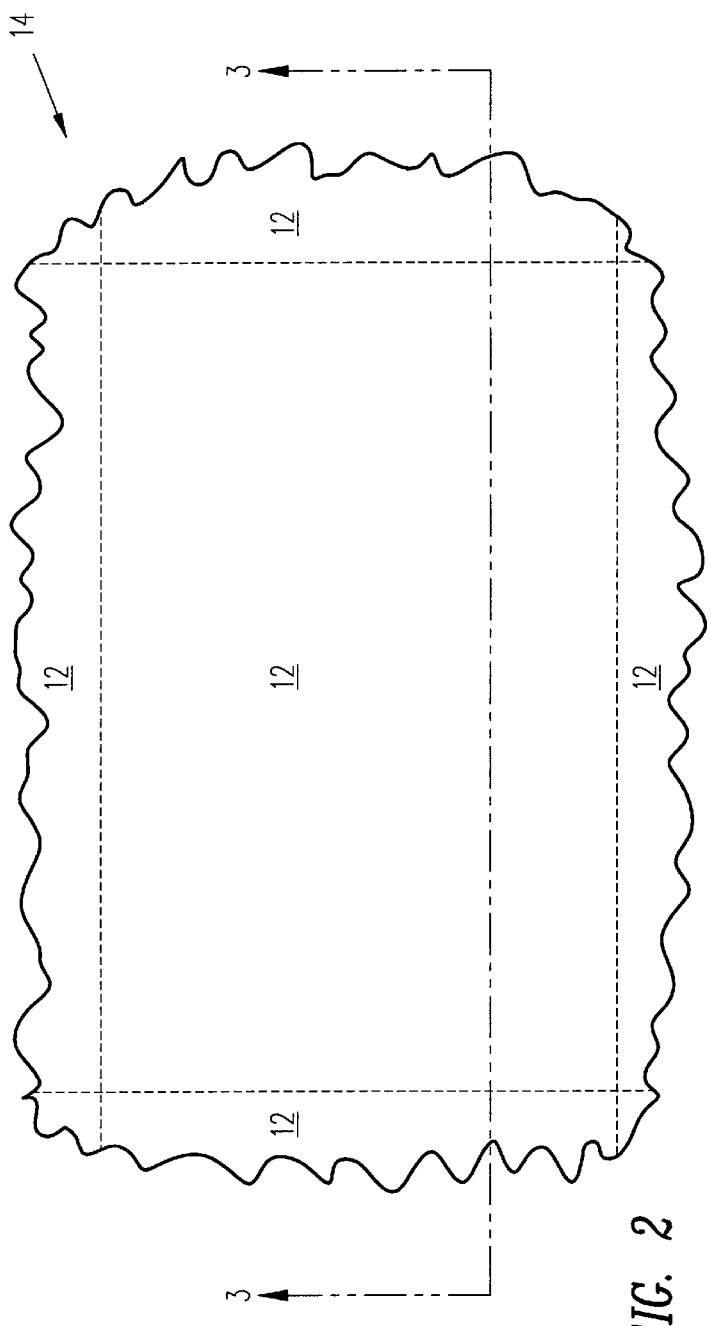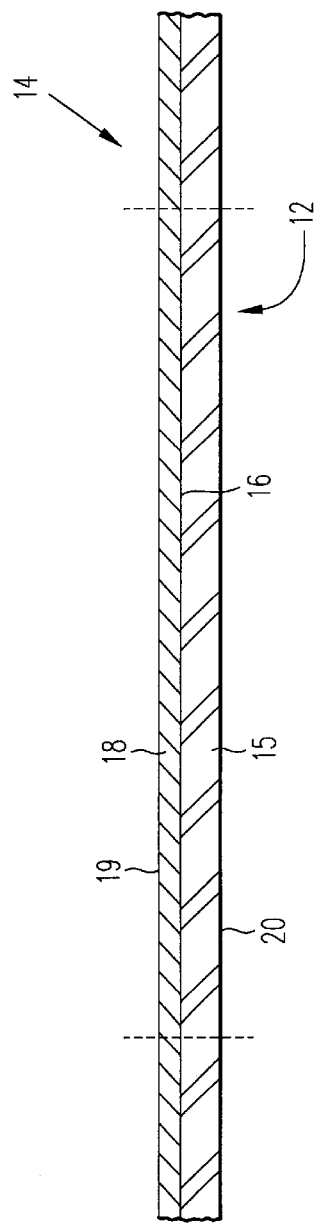
FIG. 2
FIG. 3

MAKING CHIP SIZE SEMICONDUCTOR PACKAGES

BACKGROUND OF THE INVENTION

1. Field of the Invention

This invention relates to semiconductor packaging in general, and in particular, to a method of making low cost, chip size semiconductor packages ("CSPs").

2. Description of the Related Art

The recent trend in the electronics industry towards devices that are smaller and more densely packaged has resulted in a concomitant demand for semiconductor packages which are smaller and yet provide higher component mounting densities. One response to this demand has been the development of so-called ball grid array ("BGA"), land grid array ("LGA"), and lead-less chip carrier ("LCC") packages that lack conventional leads, have a "footprint" that is the same size as the package, and are "chip size," in that they have virtually the same length and width as those of the semiconductor die or "chip" packaged therein.

A near-chip-size, micro-BGA ("$\mu$BGA") package developed by Tessera, Inc., is described in "Reliable BGAs Emerge In Micro Form," *Electronic Engineering Times* p. 104, 111 (September 1994), T. H. DiStefano. In such packages, pads on the die are connected to metallizations on a flexible polyimide resin tape substrate by tape automated bonding ("TAB") techniques. A compliant elastomeric layer, or "interposer," is disposed between the die and the substrate, and is attached to the face of the die with a layer of a silicon rubber. The die, in turn, is bonded to a "thermal spreader" with a layer of adhesive, and the die and TAB bonds are overmolded with a flexible, silicone resin envelope.

The Mitsubishi Company of Tokyo, Japan, has also developed a chip size package (the "MCSP") that uses a "flip chip" method of attaching a die to a substrate and reduces the number of different materials and material interfaces required in the package, as compared to the $\mu$BGA described above. While this reduction achieves a desirable increase in product reliability, the gain is offset somewhat by certain cost increases in the package resulting from the processes used in its fabrication, including forming interconnecting solder bumps on the substrate, rather than on the die, the use of "standoffs" to prevent collapse of the chip onto the substrate, the plating of connection pads on the die with an expensive under-bump metallization ("UBM") such as gold, the use of a "hot gas" method of attachment of the die to the substrate, and the need to mold the bodies of the packages individually, rather than molding a large number of packages simultaneously, and in two separate operations, rather than in a single step.

A need therefore exists in the industry for a low cost, reliable, chip size semiconductor package that uses conventional CSP assembly processes, yet one which reduces the total number of materials and material interfaces in the package, as well as the number of process steps used in its fabrication. This need is particularly felt in the highly competitive, high-volume, memory chip field, where packaging costs and reliability can be determinative of profit or loss.

BRIEF SUMMARY OF THE INVENTION

The present invention provides a method for making low cost, chip size semiconductor packages that uses conventional packaging materials and processes, is well suited for making low cost memory packages, and results in packages with enhanced reliability.

One embodiment of a method in accordance with the present invention includes preparing a semiconductor die by forming solder bumps on the input/output pads of the die. An insulative substrate having a first surface with a pattern of metallizations formed thereon is also prepared. The metallizations comprise a plurality of pads corresponding to the pads on the die, a plurality of solder ball lands, and a plurality of traces connecting the pads to the lands. A second surface of the tape opposite the first surface has a plurality of openings formed through it at locations corresponding to the locations of the lands, so that the lands are exposed through the second surface of the tape by the openings. Of importance, the substrate has one or more vent openings formed through it in a central region thereof, and can be formed simultaneously with the land openings.

A solder mask is formed over the metallizations on the substrate. The mask includes apertures through which the pads on the substrate are exposed, as well as one or more vent openings corresponding to the vent openings in the substrate.

The die is placed on the masked substrate such that the die is located over the one or more vent openings in the solder mask and the substrate, and such that the solder bumps on the die contact the corresponding pads on the substrate through the apertures in the solder mask. The solder mask functions both conventionally and as a "standoff" for the die, and defines a narrow space between the first surface of the solder mask and an opposing first surface of the die. The die is electrically connected to the substrate using the "flip chip" connection method in which the solder bumps between corresponding pads on the die and the substrate are reflowed to form a bridge between the pads.

The substrate and the attached die are placed in the cavity of a mold. Molten plastic is forced into the cavity such that the plastic displaces the air in the cavity and forces it out of the cavity through the one or more vent openings in the substrate and solder mask, thereby forming a body of an insulative material on the first surface of the substrate that simultaneously overmolds the semiconductor die and underfills the space between the substrate and the die in a single step.

By using a single-sided substrate with a solder mask, reflowed eutectic solder balls formed on the die, a flip chip interconnection method, and a single-step package molding and underfilling process, the present invention utilizes only conventional fabrication methods, yet permits a reduction over the prior art in the total number of materials and material interfaces required in the package, and hence, an increase in its reliability. It also permits a reduction in the number, complexity and expense of the processes required by prior art packaging methods, such as forming metallizations on both sides of the substrate, connecting the metallizations with plated-through via holes, the use of standoffs and/or gold plating on the metallizations on the substrate, TAB or wire bonding of the die, hot gas attachment of the die, forming bumps on the substrate, and molding package bodies individually and/or in a two-step molding process involving separate underfilling and over-molding steps.

BRIEF DESCRIPTION OF THE SEVERAL VIEWS OF THE DRAWINGS

The above and other features and advantages of the present invention will be more readily understood from a consideration of the detailed description of exemplary embodiments thereof below, particularly if such consideration is made in conjunction with the associated drawings, wherein:

FIG. 2 is a top plan view of a single substrate contained in a section of an array of identical, integrally connected substrates;

FIG. 3 is a cross sectional elevation view looking into the section of the substrate array of FIG. 2, as revealed by a section taken in FIG. 2 along the lines 3—3;

DETAILED DESCRIPTION OF THE EXEMPLARY EMBODIMENTS

Figure 1:
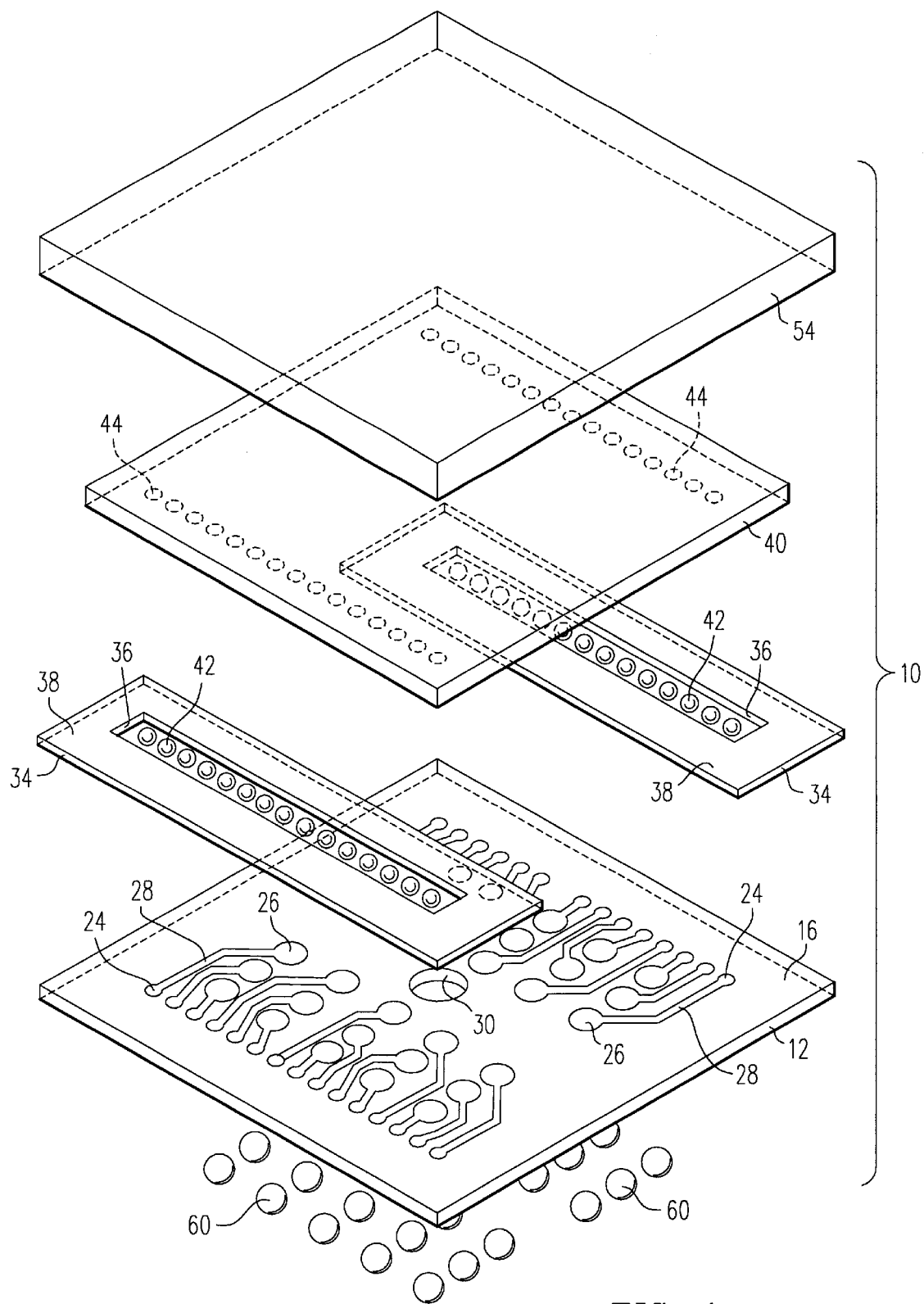
FIG. 1 is an exploded isometric view of a low cost chip size semiconductor package made in accordance with the present invention.

The low cost, BGA-type of chip size package ("CSP") 10 in accordance the present invention is shown in the exploded isometric view of FIG. 1. The package comprises a insulative substrate 12 having a first surface 16 with a pattern of metallizations 22 formed on it. An insulative solder mask 34 is formed over the metallizations on the substrate. Both the substrate 12 and the solder mask 34 have one or more corresponding vent openings 30 formed in their respective central portions.

A semiconductor chip, or die 40, is electrically connected through apertures 36 in the solder mask 34 to the pattern of metallizations 22 on the substrate 12 in accordance with the "flip chip" method described in more detail below.

A body 54 of an insulative material is formed on the first surface 38 of the solder mask 34 such that the semiconductor die 40 and the narrow space between the solder mask and the die are respectively overmolded and underfilled with the insulative material in a single step, as described in more detail below.

Figure 5:
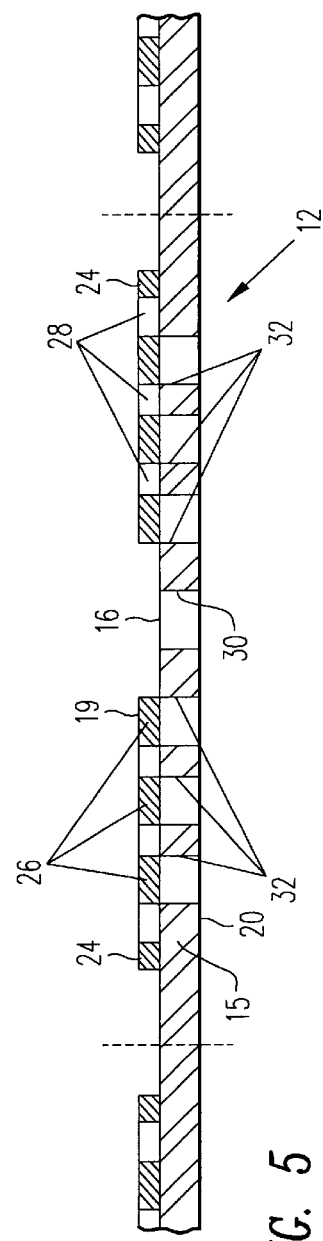
FIG. 5 is a cross sectional elevation view looking into the section of the substrate array section of FIG. 4, as revealed by a section taken in FIG. 4 along the lines 5—5.

The substrate 12 has a second surface 20 opposite to its first surface 16 with a plurality of land openings 32 formed therein, each opening exposing the bottom surface of a land 26 formed on the first surface of the substrate (see FIGS. 3 and 5). In one embodiment, a solder ball 60 is formed on each of the lands 26 inside each of the land openings 32 to serve as an input/output terminal of the package 10.

Figure 9:
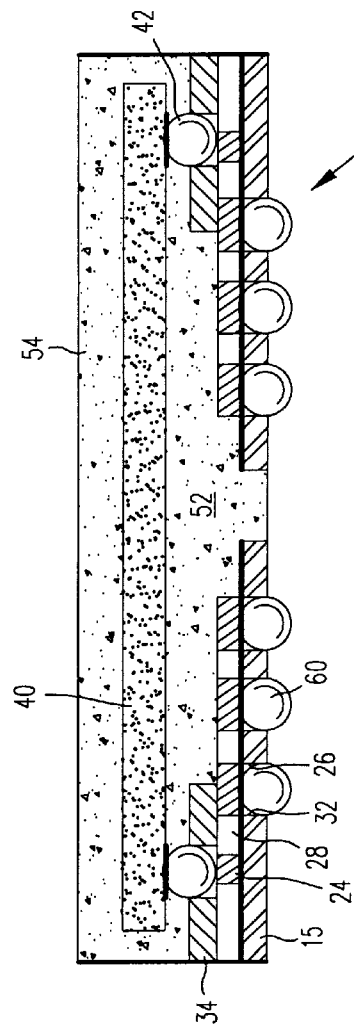
Figure 10:
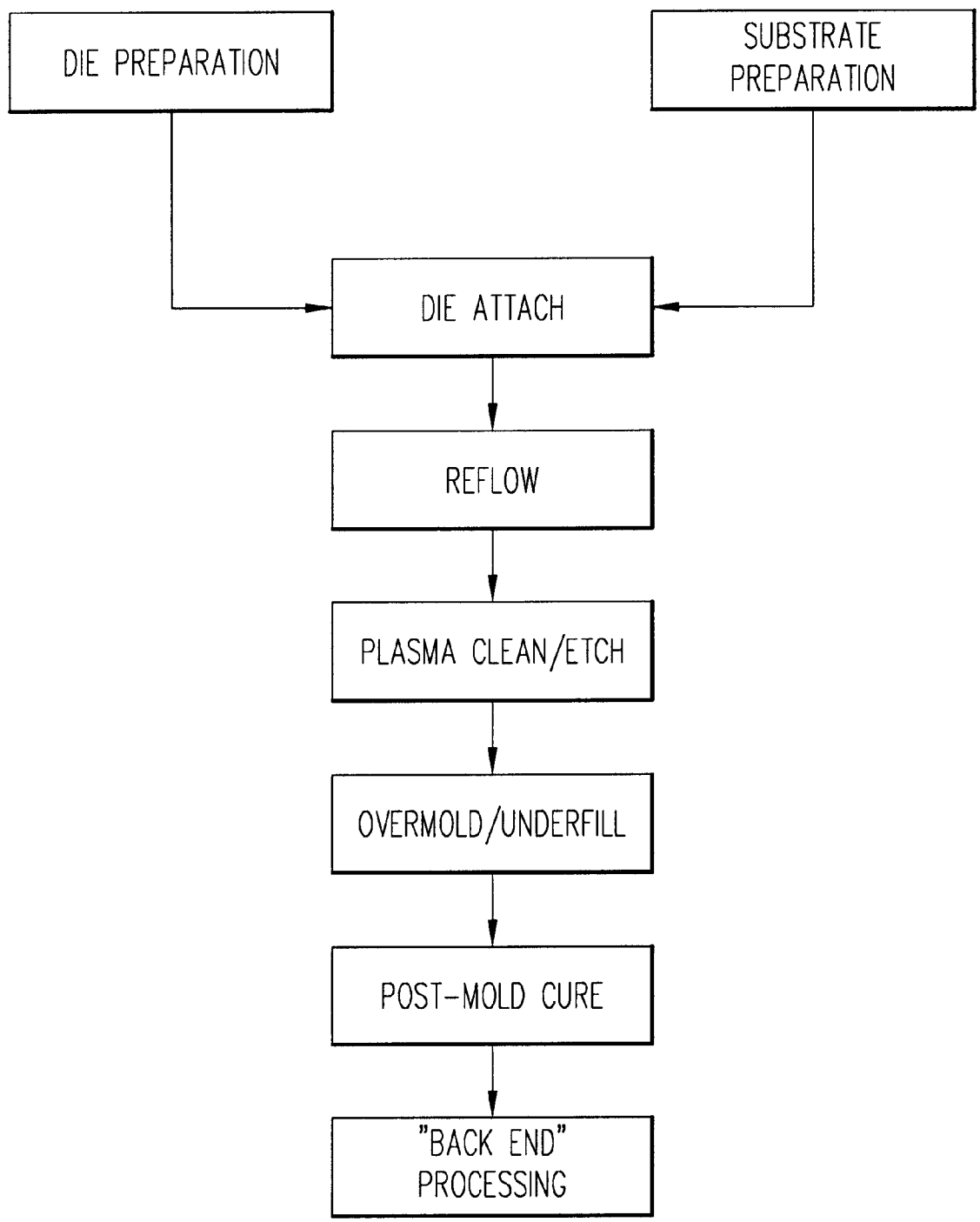

A flow chart outlining the processes used to make the novel CSP 10 of this invention is shown in FIG. 10. These processes are described in more detail below in connection with FIGS. 2–9, which sequentially illustrate the fabrication of the CSP.

As shown in FIG. 2, the method of the present invention comprises the preparation of an insulative substrate 12, shown outlined in phantom lines in the plan view of FIG. 2. In one embodiment, the substrate 12 comprises one of a plurality of identical substrates 12 connected to each other in a large, integral array thereof. A section 14 of such an array is shown in the plan views of FIGS. 2 and 4. Such an array of substrates 12 may comprise, for example, a strip of four groups of substrates each (i.e., 5×5 substrates per group), to enable the simultaneous "gang-assembly" of a large number of CSPs thereon, in the instant example, 100 CSPs at a time.

As shown in FIG. 3, the substrate 12 comprises a thin layer of a first insulative material 15 having a first surface 16 with a thin layer of metal 18 disposed on it and a second surface 20 opposite to its first surface. The metal layer 18 has an upper surface 19. In one embodiment, the substrate 12 comprises a so-called "thin core" laminate 15 of, e.g., a sheet of a polyimide resin overlain with a thin layer 18 of copper. Other possible insulative substrate materials include a variety of ceramics and epoxy-impregnated fiberglass.

Figure 4:
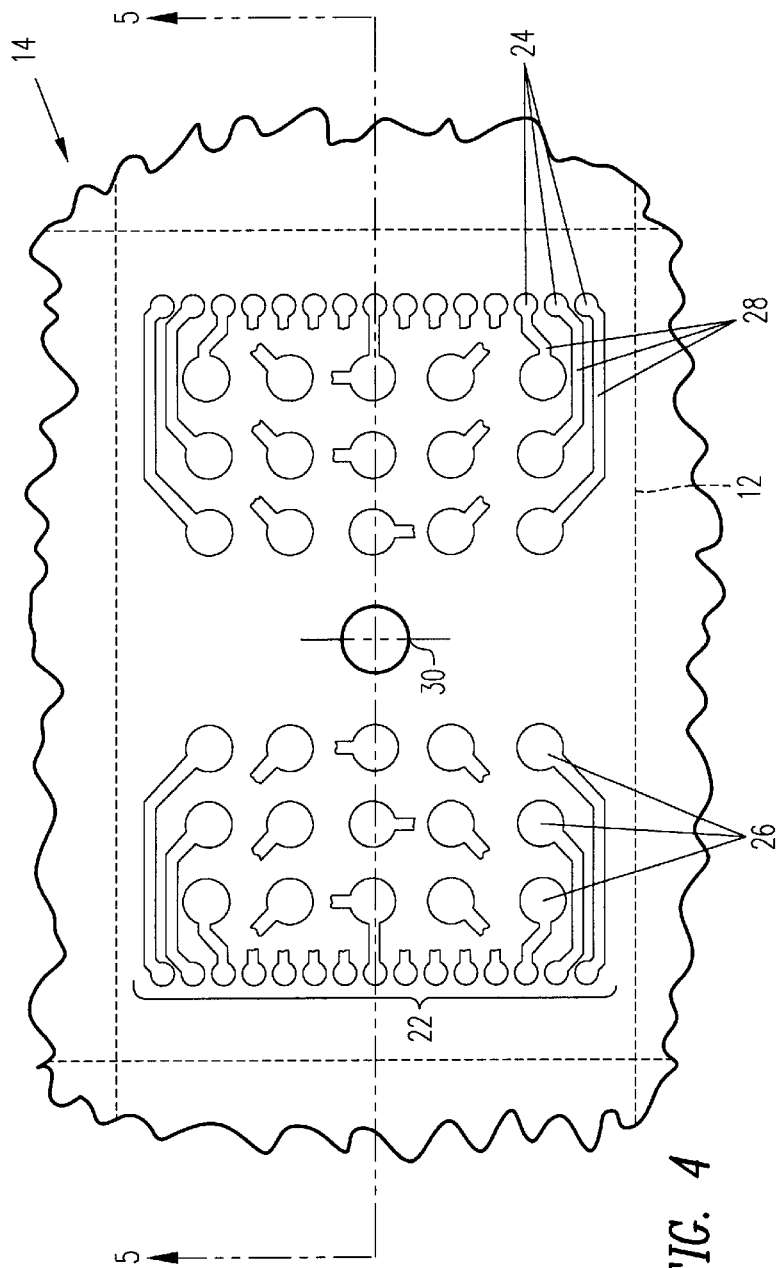
FIG. 4 is a top plan view of the substrate shown in FIG. 2, with a pattern of metallizations formed thereon.

As shown in FIGS. 4 and 5, preparation of the substrate 12 comprises forming a pattern of metallizations 22 from the layer of metal 18 on the first surface 16 of the substrate, which may be effected using conventional photolithography techniques. The pattern of metallizations 22 is formed to include a plurality of pads 24, which correspond in location to those of input/output pads 44 on an associated semiconductor die 40 (see FIGS. 1 and 7), as well as a plurality of lands 26, which are selectively connected to various ones of the pads 24 by a plurality of metal traces 28. In the embodiment illustrated, the pads 24 are located in two rows on opposite margins of the substrate to conform to the arrangement of pads on a typical memory chip, although many other chip pad arrangements are also possible. The pads 24, lands 26 and/or traces 28 may optionally be selectively plated with, e.g., a nickel-gold plating.

One or more vent openings 30 are formed in the central region of the substrate 12, as well as a plurality of land openings 32 in the second surface 20 of the substrate, as shown in the cross sectional view of FIG. 5. Each of the land openings 32 is located such that it exposes a respective one of the lands 26 through the second surface 20 of the substrate. The vent opening(s) 30 and the land openings 32 can be punched, etched, or burned into the substrate 12 with a laser, and in one embodiment, are all formed simultaneously to achieve manufacturing economy.

Figure 6:
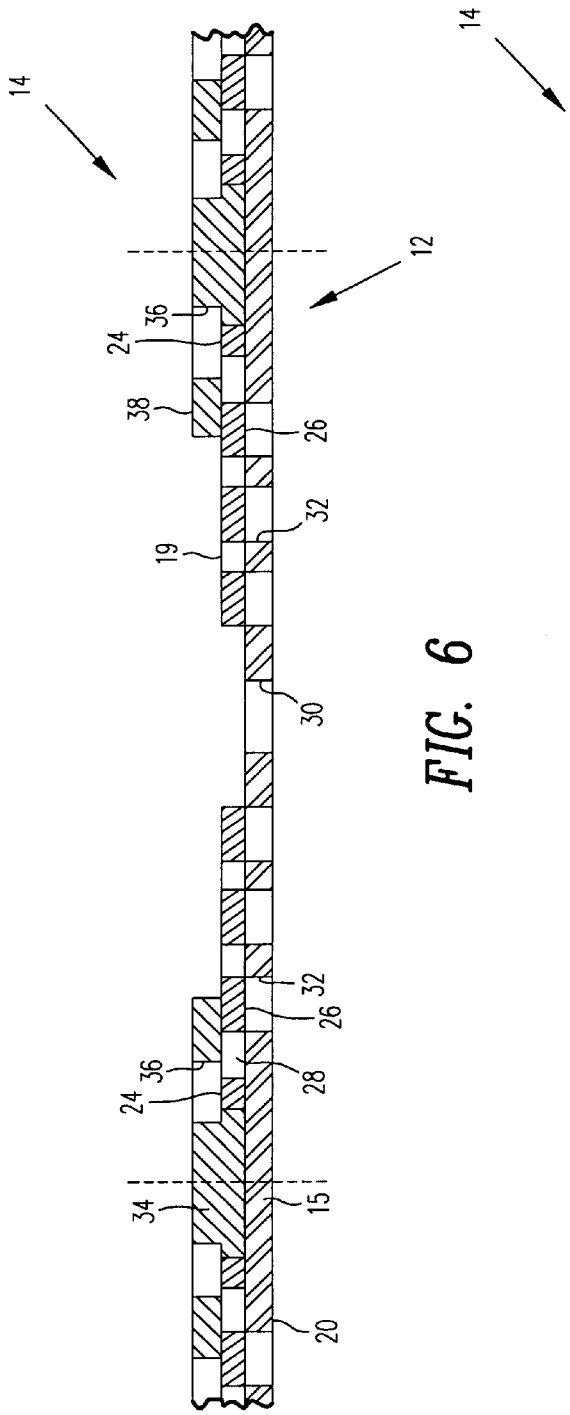
FIGS. 6–9 are cross sectional elevation views similar to FIG. 5 showing the sequential stages of making a low cost chip size semiconductor package on the substrate shown in FIGS. 2 and 4 in accordance with the present invention; and, FIG. 10 is a flow chart showing the sequential processes involved in making the low cost chip size semiconductor package of the present invention.

An insulative solder mask 34 is formed over the metallizations 22 on the first surface 16 of the substrate (see FIGS. 1 and 6). In the embodiment illustrated, the solder mask 34 comprises a pair of rectangular dams, each surrounding a respective one of the two rows of pads 24 on the opposite margins of the substrate 12. The solder mask 34 serves both as a conventional solder mask that prevents solder from flowing away from the pads 24 along the traces 28, and as a standoff that prevents the die 40 from collapsing onto the substrate 12 when the solder bumps 42 between the die and the substrate are melted, as described below. The solder mask 34 can be applied using conventional techniques, e.g., silk screening, and is formed to include one or more apertures 36 through it that are located so as to expose the pads 24 on the substrate through the mask, and a first, upper surface 38.

The exemplary embodiment illustrated in the figures lacks a center row of lands 26, and a single vent opening 30, having a diameter of about 0.1 mm (0.039 in.), is shown at the respective centers of the substrate 12. However, in an embodiment having, e.g., a center row of lands, the one or more vent opening(s) can easily be adjusted in number, location and size to avoid the lands 26 and yet provide the venting function described in more detail below.

The method of the present invention also includes the preparation of a semiconductor chip, or die 40 (see FIG. 10). This step involves forming bumps of solder 42, which in one embodiment, is a eutectic solder (63% tin, 37% lead), on pads 44 (see FIGS. 1 and 7) formed on a first, "active," surface 46 of the die 40.

When the solder bumps 42 have been formed on the die 40, they are coated with flux by inverting the die over a bath of liquid flux (not illustrated) and dipping the bumps into it.

When the solder bumps 42 have been coated with flux, the die 40 is attached to the substrate 12 using the "flip chip" method of die attachment, which was developed by IBM, Inc., in about 1965. Sometimes referred to as the "Controlled Collapse Chip Connection," or "C4," method (see, e.g., L. F. Miller, "Controlled Collapse Reflow Chip Joining," *IBM J. Res. Develop.,* 239–250 (May 1969)), the technique conventionally involves forming metal bumps on metal pads on the active surfaces of IC chips, then inverting, or "flipping" the chips upside-down and fusing the bumps to corresponding pads on the substrates, typically using standoffs between the die and the substrate to prevent the former from collapsing onto the latter during soldering.

Figure 7:
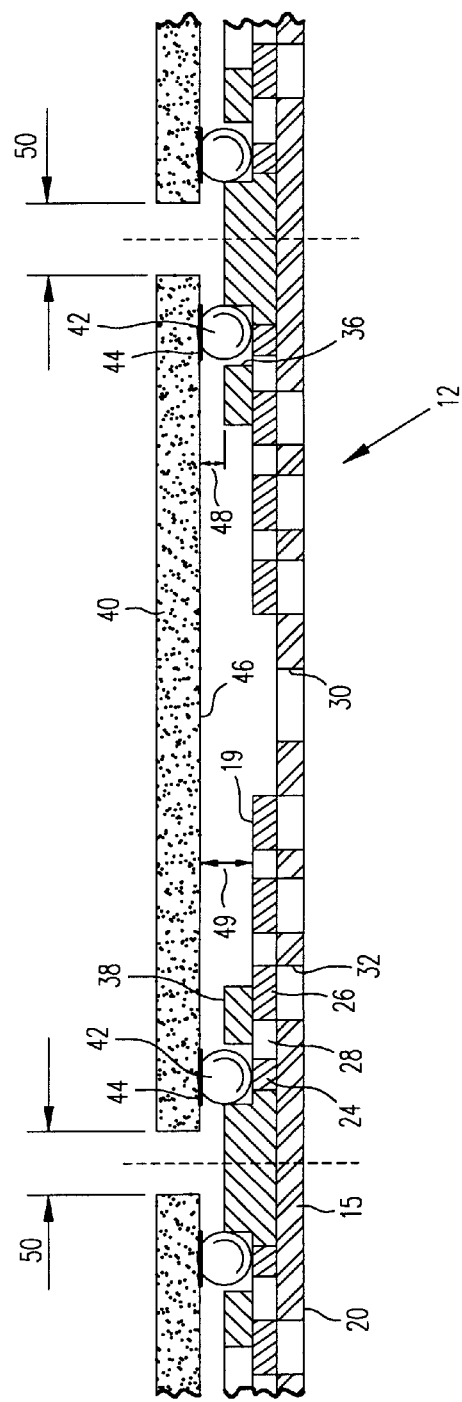

In the present method, the die 40 is placed over the solder mask 34 on the substrate 12 using conventional automated pick-and-place equipment such that the die is located over the one or more vent openings 30 in the substrate, and such that the solder bumps 42 contact their corresponding pads 24 on the substrate through the apertures 36 in the solder mask (see FIG. 7). A narrow space 48, typically about 0.051 mm (0.002 in.) thick, is defined between the respective opposing first surfaces 38 and 46 of the solder mask 34 and the die 40, and a space 49 of about 0.100 mm (0.004 in.) is defined between the first surfaces 38 of the die 40 and the upper surface 19 of the metal layer 18. In a gang-assembly of packages 10 such as is illustrated in the figures, the dies 40 are spaced laterally from each other on the substrate by a gap 50 that is typically about 2 mm (0.080 in.) wide.

The flip chip connection of the die 40 to the substrate 12 is completed by placing the entire chip-array assembly shown in FIG. 7 into an oven heated to the melting temperature of the solder bumps 42, which causes the solder to reflow and form a conductive bridge between each of the pads 24 on the substrate 12 and its corresponding pad 44 on the die 40.

Since the die 40 is relatively fragile, and its active surface 46 is susceptible to contaminants such as moisture, and because the thin substrate 12 and solder mask 34 underlying the die are relatively flexible, the narrow space 48 between the opposing respective surfaces of the die, metallizations and the substrate is typically "underfilled" with a layer 52 of an insulative sealing material, and the die and upper surface 38 of the solder mask are typically "overmolded" with a monolithic body 54 of a strong, rigid, insulative material to seal the structure and rigidize it. In prior art packages, this is accomplished in a two-step process, and typically, on only one package at a time. First, a low-viscosity liquid epoxy is dispensed at the periphery of the narrow space 48 between the die 40 and the substrate 12 such that it is drawn into the space by capillary forces, and is then cured to solidify it. The die-substrate assembly is then placed in the cavity of a mold, and a second, molten epoxy resin is injected into the cavity to overmold a rigid body over the assembly.

The method of the present invention differs from the prior art method in that the underfill layer 52 and the overmolded body 54 are formed simultaneously in and on a plurality of ganged die-substrate assemblies in a single step. This process is facilitated by the one or more vent openings 30 in the substrate 12, and is illustrated schematically in the cross-sectional view of FIG. 8.

As indicated in FIG. 10, prior to the overmolding/underfilling step, the die-substrate assemblies are subjected to a conventional plasma etching process (not illustrated) that both cleans the assemblies of any residue antithetical to good adhesion and also forms asperities on their surfaces to enhance bonding of the underfill/overmold material to them.

Figure 8:
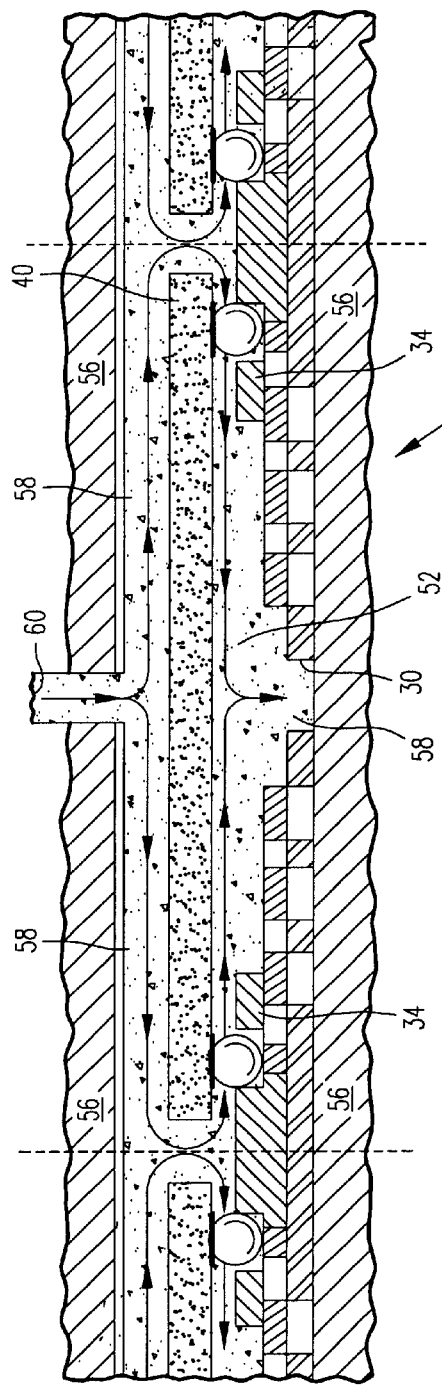

As shown in FIG. 8, after the plasma cleaning and etching step, the ganged die-substrate assemblies are placed in the cavity of a mold 56, and a molten plastic 58, e.g., a filled epoxy resin, is forced by a ram (not shown) through the gates 60 of the mold and into the cavity under a high pressure. As indicated by the arrows, the molten plastic 58 flows throughout the cavity, and particularly, through the gaps 50 between the dies 40 and into the narrow spaces 48, 49 between the dies and their respective solder masks 34 and substrates 12, respectively, thereby displacing the air in the mold and the package assemblies and forcing it out of the package assemblies through the one or more vent openings 30 in the substrate below the dies. Thus, the spaces between the cavity, the chip, and the substrate are completely filled with the plastic material 58, and the vent openings 30 prevent a void from being formed in the underfill layer 52 between die 40 and the solder mask 34, and enabling the underfill layer and the overmolded body 54 to be formed in and on each of the ganged die-substrate assemblies simultaneously, of the same material, and in a single molding step.

After molding is completed, the plastic 58 is partially cured while the ganged die-substrate assemblies are still in the mold 56 to at least partially solidify the plastic. The molded assemblies can then be safely removed from the mold and transferred to, e.g., an oven (not illustrated) for a post-molding cure of the plastic material 58 to completely solidify it, as shown in the flow chart of FIG. 10.

After the package bodies 54 are completely cured, the still-connected CSPs 10 are finished in a series of conventional, "back end" packaging processes, as shown in FIG. 10, which include testing and marking of the packages, attachment of the solder ball input/output terminals 60 to the lands 26 through the land openings 32, and the "singulation," i.e., separation, of the individual CSPs 10 from the ganged assemblies, which is typically effected by sawing the packages apart from one another along the dotted lines 62 around the peripheries of the substrates 12 shown in the figures.

The finished low cost CSP 10 of the invention is shown in cross section in FIG. 9, and can typically have a length and width of, e.g., from about 6 to 12 mm (0.24 to 0.47 in.) on a side, and a thickness of, e.g., from about 0.5 mm to 1.0 mm (0.2 to 0.4 in).

By using a substrate with metallizations on only one side, the complexity and expense of patterning and interconnecting a double-sided substrate are avoided. The use of an inexpensive solder mask, coupled with reflowed eutectic solder balls formed on the die and a flip chip interconnection method, eliminate the need for an "interposer," TAB bonding, chip-to-substrate standoffs, forming solder bumps or gold plating on the substrate, and hot-gas attachment of the die to the substrate. Also, the single-step, gang-molding and underfilling process eliminates the inefficient molding of package bodies individually and/or in a two-step process involving separate underfilling and overmolding steps.

Thus, the present invention utilizes conventional fabrication techniques, yet permits a reduction in the number of materials and material interfaces, as well as the number, complexity and expense of the processes required by prior art packaging methods, and hence, results in a low cost CSP with enhanced reliability.

Those of skill in the art will recognize that many variations and modifications are possible in terms of the materials and methods of the present invention without departing from its spirit. Accordingly, the scope of the present invention should not be measured by that of the particular exemplary embodiments described and illustrated herein, but rather, by that of the claims appended hereafter.

What is claimed is:

1. A method for making a semiconductor package, the method comprising:

providing a semiconductor die;

providing an insulative substrate having a first surface with a pattern of metallizations thereon, an opposite second surface, and one or more vent openings extending through it;

electrically connecting the die to the metallizations on the first surface of the substrate such that the die is located over the one or more vent openings in the substrate, and such that a space is defined between the first surface of the substrate and a central portion of an opposing first surface of the die; and, molding a monolithic body of a first insulative material on the first surface of the substrate such that the insulative material simultaneously overmolds the semiconductor die and underfills the space between the substrate and the central portion of the die in a single step.

2. The method of claim 1, further comprising forming electrically conductive bumps on metal pads on the first surface of the die.

3. The method of claim 2, wherein the electrically conductive bumps comprise solder, and further comprising coating the bumps with a flux.

4. The method of claim 1, wherein providing an insulative substrate comprises:

forming a pattern of metallizations on the first surface of the substrate, the metallizations comprising a plurality of pads, a plurality of lands, and a plurality of traces connecting selected ones of the pads to various ones of the lands;

forming a mask of a second insulative material over the first surface of the substrate such that the mask exposes a region of the first surface of the substrate corresponding to a central portion of the die, the mask having apertures in it through which the pads on the substrate are exposed, and one or more vent openings through it corresponding in number, size and location to the one or more vent openings in the substrate; and, forming land openings in the second surface of the substrate at locations corresponding to the lands on the first surface of the substrate such that the lands are exposed through the second surface of the substrate by the openings.

5. The method of claim 1, wherein the die is electrically connected to the metallizations on the first surface of the substrate with the flip chip method.

6. The method of claim 5, wherein electrically connecting the pads on the die to corresponding pads on the substrate comprises reflowing a bump of solder disposed between the pads.

7. The method of claim 1, further comprising treating the first surface of the substrate and the die with a plasma.

8. The method of claim 1, wherein molding a body of an insulative material onto the first surface of the substrate comprises:

placing the substrate and the die connected thereto in the cavity of a mold;

transferring molten plastic into the cavity such that air in the cavity is displaced by the plastic and thereby forced out of the cavity through the one or more vent openings in the substrate; and, curing the molten plastic to solidify it.

9. The method of claim 8, wherein curing the molten plastic comprises:

curing the plastic while the body is in the cavity of the mold to at least partially solidify it;

removing the body from the cavity of the mold; and, curing the plastic to further solidify it.

10. The method of claim 1, wherein providing a semiconductor die comprises providing a plurality of identical dies, wherein providing an insulative substrate comprises preparing a plurality of identical substrates integrally connected to each other in a array thereof, and further comprising singulating the semiconductor package from the array.

11. A method for making a semiconductor package, the method comprising:

providing a semiconductor die having a first surface with a plurality of bonding pads thereon;

providing a substrate having a dielectric layer and opposite first and second surfaces, the first surface having a plurality of metallizations thereon, the metallizations including a plurality of bonding pads corresponding to the bonding pads on the die;

forming a solder mask on the first surface of the substrate, the mask having a first surface spaced above and parallel to the first surface of the substrate and exposing a region of the first surface of the substrate and the bonding pads thereon;

mounting the die to the substrate with the first surface of the die opposed to the first surface of the solder mask such that corresponding ones of the bonding pads on the die and the substrate are in spaced opposition to each other, the die is supported above the first surface of the substrate by the solder mask, and a space is defined between a central portion of the first surface of the die and the region of the first surface of the substrate exposed by the solder mask;

electrically connecting selected ones of the opposed bonding pads on the die and the substrate to each other; and, molding a monolithic body of an insulative plastic on the first surface of the substrate such that the plastic simultaneously overmolds the semiconductor die and underfills the space between the substrate and the die in a single operation.

12. The method of claim 11, wherein electrically connecting selected ones of the opposed bonding pads on the die and the substrate to each other comprises attaching first electrically conductive balls to selected ones of the bonding pads on at least one of the substrate and the die.

13. The method of claim 12, wherein the substrate comprises a layer of metal laminated to a flexible polyimide tape.

14. The method of claim 12, wherein the first electrically conductive balls comprise solder, and wherein mounting the die to the substrate comprises melting the solder until the first surface of the die collapses onto and is supported by the first surface of the solder mask.

15. The method of claim 14, further comprising dipping the first conductive balls into a flux.

16. The method of claim 11, wherein the metallizations include a plurality of lands, and further comprising:

forming land openings in the second surface of the substrate to expose respective ones of the lands through the openings.

17. The method of claim 16, further comprising attaching second electrically conductive balls to selected ones of the lands through the land openings.

18. The method of claim 11, further comprising etching surfaces of the die and the substrate contacted by the insulative plastic.

19. The method of claim 11, wherein molding a body of insulative plastic on the first surface of the substrate comprises:

forming a vent through the substrate between the second surface of the substrate and the space between the first surfaces of the die and the substrate;

placing the substrate and mounted die in the cavity of a mold; and, transferring molten plastic into the cavity such that air in the cavity is displaced by the plastic and thereby forced out of the cavity through the vent opening in the substrate.

20. The method of claim 11, wherein the die comprises a semiconductor memory die.

21. A method for making a plurality of semiconductor packages, the method comprising:

providing a plurality semiconductor dies, each die having a first surface with a plurality of bonding pads thereon;

providing a substrate having a first surface with a plurality of die mounting sites thereon, each site comprising at least one associated vent hole extending through the substrate thereat and an associated pattern of metallizations therein;

mounting at least one of the dies to an associated one of the die mounting sites so that the first surface of the at least one die faces and covers the at least one vent hole thereat and the bonding pads of the at least one die are electrically connected to the associated metallizations of the associated die mounting site;

placing the substrate in a single mold cavity;

molding a monolithic body of an insulative material over the plurality of die mounting sites of the substrate in such a manner that the insulative material covers all of the plurality of dies mounted on the substrate, fills a space between the respective first surfaces of each of the dies and the substrate, and fills all of the vent holes of the substrate in a single operation; and, severing through the substrate and the molded insulative material around each die mounting site to singulate the plurality of packages therefrom.

22. The method of claim 21, wherein the severing is performed by sawing.

23. The method of claim 21, wherein providing the substrate comprises forming a mask of a second insulative material on an associated one of each of the die mounting sites of the substrate, each mask including one or more vent openings through it corresponding in number, size and location to the at least one associated vent hole in the substrate thereat and exposing selected portions of the associated site, including selected portions of the associated metallizations therein.

24. The method of claim 23, wherein the solder mask of each die mounting site has a first surface opposite to the first surface of the substrate, and wherein mounting at least one of the dies to an associated one of the die mounting sites comprises mounting the first surface of the at least one die facing the first surface of the solder mask such that the solder mask prevents the die from collapsing onto the substrate.

25. The method of claim 23, wherein the associated metallizations of each die mounting site comprise bonding pads, and wherein the bonding pads are exposed through apertures in the associated solder mask thereon.

26. The method of claim 25, wherein the bonding pads are located in a peripheral portion of each die mounting site.

27. The method of claim 25, wherein the bonding pads are located in a central portion of each die mounting site.

28. The method of claim 21, wherein the associated metallizations of each die mounting site comprise lands, and wherein providing a substrate comprises forming openings exposing respective ones of the lands in a second surface of the substrate opposite to the first surface thereof.

* * * * *